Nov. 28, 1967 P. C. BAUMANN 3,355,635

SEMICONDUCTOR DEVICE ASSEMBLAGE HAVING TWO CONVEX TABS

Filed May 28, 1964

INVENTOR.
PHILIP C. BAUMANN
BY
W.S. Hill
AGENT

United States Patent Office 3,355,635
Patented Nov. 28, 1967

3,355,635

SEMICONDUCTOR DEVICE ASSEMBLAGE HAVING TWO CONVEX TABS

Philip C. Baumann, Findlay, N.J., assignor to Radio Corporation of America, a corporation of Delaware Filed May 28, 1964, Ser. No. 371,009
3 Claims. (Cl. 317—234)

ABSTRACT OF THE DISCLOSURE

A semiconductor device assemblage comprising two spaced metallic tabs, each tab having a central perforation. Around the perimeter of each central perforation is a planar lip. The tabs are spaced so that their convex sides face each other, and their central perforations are concentric, and their planar lips are parallel. A semiconductive die having two opposing major faces positioned centrally between the convex sides of the two tabs has its major faces parallel to the planar lips, each major die face being bonded to a different tab at the planar lip, so that the semiconductive die is the only rigid connection between the two tabs.

*Background of the invention*

(*1*) *Field of the invention.*— This invention relates to improved semiconductor device assemblages, and improved methods of fabricating them.

(*2*) *Description of the prior art.*—In the fabrication of semiconductor devices, it is customary to mount the semiconductive die or wafer on a support for convenience in handling the die during processing and encapsulation and casing. Since the semiconductive die is small and fragile, it is usually bonded to a mechanically strong support such as a metal tab, which in turn is attached to one of the leads of the device. The metal tab may be a single flat plate, as illustrated in FIGURE 3*d* of U.S. Patent 2,964,431, issued Dec. 13, 1960, to I. H. Kalish et al., and assigned to the assignee of this application, or a perforated keyhole-shaped plate, as illustrated in FIGURE 1 of U.S. Patent 2,962,639, issued Nov. 29, 1960 to L. Pensak, and assigned to the assignee of this application. Alternatively, the tab may be a U-shaped spring clip which cradles the semiconductive die, as illustrated in FIGURE 4 of U.S. Patent 2,913,642, issued to D. A. Jenny on Nov. 17, 1959, and assigned to the assignee of this application. The metallic tab serves as a mechanical support for the semiconductive die; the tab also serves as an electrical connection to the die; additionally, the tab serves as a heat sink to remove heat generated in the die during the operation of the device.

It is an object of this invention to provide improved semiconductor device assemblages.

Another object of the invention is to provide an improved method of mounting semiconductor devices.

Still another object is to provide a rapid, simple and inexpensive method of mounting semiconductor devices on a support.

But another object is to provide an improved method of mounting semiconductor devices on supports such as metallic tabs to obtain a high yield of device assemblages having low electrical and thermal resistance.

*Summary of the invention*

These and other objects are attained according to the invention by providing a semiconductor device assemblage comprising two spaced cambered metallic tabs. Each tab has a central perforation. The tabs are spaced so that their convex sides face each other. A semiconductive die having two opposing major faces is positioned centrally between the convex sides of the two tabs. Each major face of the semiconductive die is larger in area than each tab perforation, but smaller in area than the tab. Each major face of the die is bonded to a different one of the two tabs around the perimeters of the tab perforations.

The exact composition, shapes and dimensions of the tabs is not critical. Preferably, each tab is provided with a lip having a planar surface on the convex side of the tab around the periphery of the central perforation within the cambered or curved "dished" portion of the tab. Suitably, the major die faces are positioned parallel to the planar surfaces of the lips around the periphery of each tab aperture, so that each aperture is entirely within the area of one major die face. The two tabs are then bonded to the die, one die face being bonded to the planar lip on one tab, and the other die face being bonded to the planar lip on the other tab.

*Description of the preferred embodiment*

EXAMPLE

Figure 1:
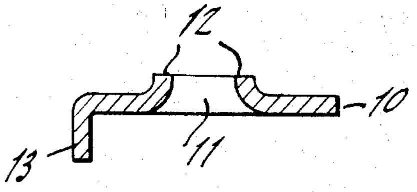
FIGURES 1–3 are cross-sectional elevational views of successive steps in the fabrication of a semiconductor device assemblage according to one embodiment of the invention; and, FIGURE 4 is a perspective view, partly in section, of the completed device, with the semiconductive die in phantom.

Referring now to FIGURE 1, a cambered metallic tab 10 is prepared with a central perforation 11 in the curved or "dished" portion of the tab. Preferably, tab 10 is provided with a lip 12 in the form of a planar annular surface or ring on the convex side of tab 10 around the periphery of perforation 11. The exact size, shape, and composition of tab 10 are not critical. In this example, tab 10 is square in shape, about 100 mils on edge, and about 3 mils thick. The central perforation 11 may be of any convenient shape. In this example, perforation 11 is circular, and about 40 mils in diameter at the convex side of tab 10. The planar annular lip or ring 12 on the convex side of tab 10 around the periphery of perforation 11 is of the same thickness as the tab, that is, about 3 mils in this example. Conveniently, tab 10 is provided with a flange 13 at one end. In this example, flange 13 is about 25 mils long. Tab 10 may be made of a single metal, such as nickel, or of various alloys, such as the nickel-iron-cobalt alloys commercially available as Kovar and Fernico.

Figure 2:
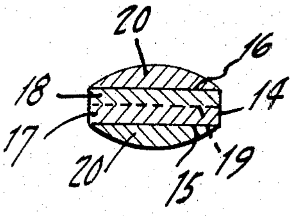

A semiconductive die 14 (FIGURE 2) is prepared with two opposing major faces 15 and 16. The die 14 may consist of any of the crystalline semiconductors utilized in the art, including elemental semiconductors such as germanium and silicon, semiconductive alloys such as germanium-silicon alloys, and semiconductive compounds such as the phosphides, arsenides and antimonides of boron, indium, and gallium, or the sulfides and selenides of zinc and cadmium. In this example, die 10 consists of monocrystalline silicon, and has a given conductivity type region 17 adjacent one major die face 15, an opposite conductivity type region 18 adjacent the opposing die face 16, and a rectifying barrier or P–N junction 19 at the interface between the two regions. The exact shape of die 14 is not critical. In this example, die 14 is a disk about 60 mils in diameter and about 11 mils thick.

The area of die faces 15 and 16 is slightly greater than the area of the tab perforation 11, but the metallic tab 10 is considerably larger in area than the semiconductive die 14. A solder coating 20 a few mils thick is deposited on major die faces 15 and 16 by any convenient method, such as by evaporation, or by dipping the die in molten solder. The solder may be lead, tin, lead-tin alloys, or the like. In this example, the solder coating 20 is deposited by dipping in a melt, consists of 99 weight percent lead—1 weight percent tin, and is about 5 mils thick at the center of each die face, tapering down to the die edges. Flat solder coatings may also be utilized.

Figure 3:
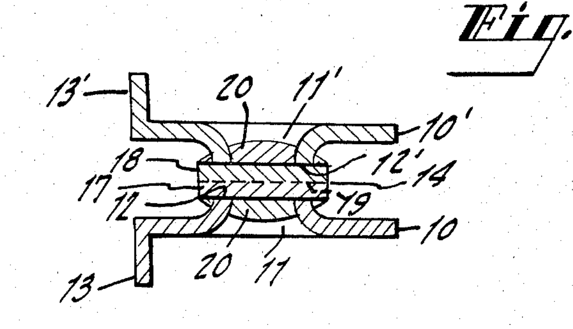

A second cambered metallic tab 10′ (FIGURE 3) is prepared with a central aperture 11′ in the "dished" portion of the tab, a planar annular lip 12′ on the convex side of the tab around the periphery of aperture 11′, and a flange 13′. The second tab 10′ is substantially identical to the first tab 10. The two cambered metallic tabs 10 and 10′ are spaced with their convex sides facing each other, so that their apertures 11 and 11′ respectively are concentric, and their planar annular lips 12 and 12′ respectively are parallel. The solder-coated semiconductive die 14 is positioned between the spaced lips 12 and 12′ with the solder-coated major die faces 15 and 16 parallel to and touching the planar lips 12 and 12′, so that the area of one tab aperture 11 is completely within the area of one die face 15, and the area of the other tab aperture 11′ is completely within the area of the other die face 16. The assemblage, consisting of die 14 and the two cambered metallic tabs 10 and 10′, is now bonded together. This may conveniently be accomplished by heating the assemblage in a reducing ambient to a suitable temperature above the melting point of the solder coating 20 on tabs 10 and 10′, but below the melting point of the other components present. In this example, the bonding step is performed by heating the assemblage for about 3 minutes at about 350° C. in a non-oxidizing ambient such as hydrogen or forming gas or the like. The assemblage is then cooled to room temperature in the same reducing ambient. In the bonded assemblage thus formed, the semiconductive die 14 is protected by the two tabs 10 and 10′, which have a larger area than the area of the die.

Figure 4:
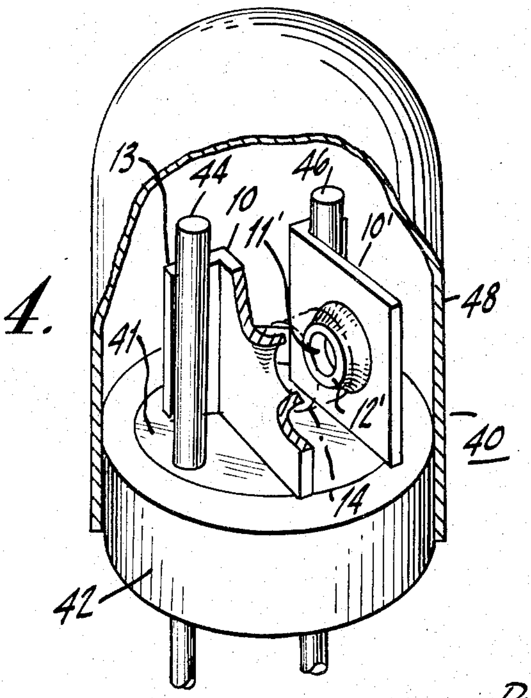

The assemblage of semiconductive die and two cambered tabs may then be cased by any convenient method. In this example, the completed device 40 (FIGURE 4) comprises a mounting stem consisting of an insulating mass as the mounting base. The mounting base may for example comprise a glass disk 41 surrounded by a metallic annulus 42. Two spaced metallic lead wires or pins 44 and 46 are embedded in the insulating disk 41. The assemblage of semiconductive die 14 and the two cambered tabs 10 and 10′ is positioned on the insulating disk 41 between the two leads 44 and 46, so that one tab flange 13 contacts one lead 44, and the other tab flange 13′ contacts the other lead 46. Flange 13 is bonded to lead 44, and flange 13′ is bonded to lead 46, for example by spot welding. The assemblage of semiconductive die and cambered tabs may now be coated with a drop of a liquid synthetic resin such as a silicone or the like. The completed assemblage may be cased by means of a metal can 48 which fits over the metallic annulus 42 and forms an intereference fit thereto, as described in Ollendorf and Meisel U.S. Patent 2,965,962, issued Dec. 27, 1960, and assigned to the assignee of this application.

When the semiconductive die 14 and the two cambered metallic tabs 10 and 10′ are bonded together in a furnace, it is convenient to keep them appropriately positioned during the heating by any one of a variety of jigging means known to the art. Since a large number of assemblages may thus be placed in a single jig, and a number of such jigs passed through the furnace as a group in a single heating step, the mounting method described is simple, rapid, and inexpensive. As the number of individual handling steps required for fabrication is minimized, the method is suitable for mass production.

One advantage of the semiconductor device assemblage described is that dissipation of the heat generated in the semiconductive die during device operation is improved because the two base tabs serve as two heat radiating fins. As a result, these devices exhibit greater reliability on life tests than the single tab devices according to the prior art.

Another advantage of the device assemblage is that the apertured cambered shape of the metallic tabs utilized reduces the soldered contact area between each tab and the die to the area of the narrow annular lip or ring on the convex side of each tab around the periphery of the tab apertures. As a result, the transmission of thermal expansion and contraction stresses to the semiconductive die, when the device is temperature cycled, is reduced as compared to the prior art device assemblages.

Still another advantage of the device assemblage is that the aperture of each tab, being only a little less than the area of the die face bonded to the tab, permits any excess molten solder to flow over the surface of the die within the tab aperture without pulling back from the die surface when the assemblage is cooled. In the comparable device assemblages of the prior art, solder "pull-back" is one of the defects that reduces the yield of satisfactory devices.

Actual factory tests have shown that as a result of the above advantages, the yield of satisfactory device assemblages prepared as described is increased by 7% as compared to the yield of similar device assemblages including a single flat base tab.

The above example is by way of illustration only, and not limitation. For example, the device described above is a two-terminal diode. It will be seen that tunnel diodes, variable capacitance diodes, and pnpn diodes can be similarly mounted. Semiconductive dies formed into multiple terminal devices such as triode transistors and tetrodes can be similarly mounted by providing additional leads through the insulating disk, and attaching the upper portions of these additional leads by means of connector wires to the desired portions of the semiconductive die. Any of the crystalline semiconductors known to the art may be utilized instead of silicon for the die. Instead of having the solder coating on the semiconductive die, a solder coating about 0.5 to 1 mil thick may be deposited on the two metallic tabs. Bonding is then accomplished by heating the assemblage as described above. Various other modifications may be made without departing from the spirit and scope of the invention as set forth in the specification and appended claims.

What is claimed is:

1. A semiconductor device assemblage comprising:
two spaced cambered metallic tabs,
each said tab having a central perforation,
said tabs being spaced so that their convex sides face each other; and,
a semiconductive die having two opposing major faces positioned centrally between said convex sides of said tabs,
each said die face being larger in area than each said perforation but smaller in area than each said tab,
each said major die face being bonded to a different one of said tabs around the perimeters of said perforations, said semiconductive die being the only rigid connection between said two tabs.

2. A semiconductor device assemblage comprising:
two spaced cambered metallic tabs,
each said tab having a central perforation,
a lip on the convex side of each said tab around the perimeter of said perforations,
said tabs being positioned so that their convex sides face each other and their perforations are concentric; and,
a semiconductive die having two opposing major faces positioned centrally between the convex sides of said tabs,
the area of said die faces being greater than the areas of said tab perforations but less than the area of said tabs,
each said major die face being bonded to a different one of said lips around the perimeter of said perforations, said semiconductive die being the only rigid connection between said two tabs.

3. A semiconductor device assemblage comprising:

two spaced cambered metallic tabs, each said tab having a central perforation, a planar annular lip on the convex side on each of said tabs around the perimeters of said perforations, said tabs being spaced so that their convex sides face each other and their perforations are concentric and their lips are parallel; and, a semiconductive die having two opposing major faces positioned centrally between the convex sides of said tabs, said major die faces being parallel to said lips, the area of said die faces being greater than the areas of said tab perforations but less than the area of said tabs, each said tab perforation being entirely within the area of one said major die face, each said major die face being bonded to a different one of said lips around the perimeter of said perforations, said semiconductive die being the only rigid connection between said two tabs.

References Cited

UNITED STATES PATENTS

| | | | |
|---|---|---|---|
| 2,759,133 | 8/1956 | Mueller | 317—235 |
| 2,876,401 | 3/1959 | Fuller | 317—235 |
| 3,224,069 | 12/1965 | Thorne | 29—25.3 |

JAMES D. KALLAM, *Primary Examiner.*

JOHN W. HUCKERT, *Examiner.*

M. EDLOW, *Assistant Examiner.*